United States Patent [19]

Minuhin

[11] Patent Number: 4,737,765
[45] Date of Patent: Apr. 12, 1988

[54] 2,7 CODE DECODER WITH NO MORE THAN 3 BITS ERROR PROPAGATION

[75] Inventor: Vadim B. Minuhin, Bloomington, Minn.

[73] Assignee: Magnetic Peripherals Inc., Minneapolis, Minn.

[21] Appl. No.: 921,303

[22] Filed: Oct. 22, 1986

[51] Int. Cl.⁴ ............................................. H03M 7/00
[52] U.S. Cl. .............................. 340/347 DD; 360/39; 360/40
[58] Field of Search ............ 340/347 DD; 360/39–44; 375/76; 235/310, 311

[56] References Cited

U.S. PATENT DOCUMENTS

| | | | |
|---|---|---|---|
| 4,115,768 | 9/1978 | Eggenberger et al. | 340/347 DD |
| 4,413,251 | 11/1983 | Adler et al. | 340/347 DD |
| 4,451,819 | 5/1984 | Beckenhauer | 340/347 DD |
| 4,463,344 | 7/1984 | Adler et al. | 340/347 DD |
| 4,538,189 | 8/1985 | Fitzpatrick | 360/40 |

Primary Examiner—T. J. Sloyan
Attorney, Agent, or Firm—E. P. Heller, III; R. M. Angus

[57] ABSTRACT

A decoder for the 2,7 variable length code. A four-bit shift register sliding block decoder detects the presence of the code's four-bit ending sequence and provides decoded binary output. The decoder has only a three-bit binary error propagation.

2 Claims, 4 Drawing Sheets

2,7 CODE DICTIONARY

| WORD # | DATA WORD | | | CODE WORD | | | |
|---|---|---|---|---|---|---|---|
| | Zeroes in beginnings of data words | Ends of data words | | Beginnings of code words | | Ends of code words | |
| 1 | | 1 | 0 | | | 01 | 00 |
| 2 | | 1 | 1 | | | 10 | 00 |
| 3 | | | 0 | | 10 | 01 | 00 |
| 4 | | 1 | 0 | | 00 | 10 | 00 |
| 5 | | 1 | 1 | | 00 | 01 | 00 |
| 6 | 0 | 0 | 0 | 00 | 10 | 01 | 00 |
| 7 | 0 | 0 | 1 | 00 | 00 | 10 | 00 |

Fig. 1

2,7 CODE DECODER WITH NO MORE THAN 3 BITS ERROR PROPAGATION

BACKGROUND OF THE INVENTION

1. Field of the Invention

The invention relates to the field of code decoders and more particularly to decoders for the 2, 7 variable length code.

2. Brief Description of the Prior Art

Franazek introduced the 2, 7 variable length code in U.S. Pat. No. 3,689,899 assigned to IBM. The code is primarily useful in magnetic recording.

Eggenberger et al. provided a sliding block decoder for the 2,7 code in U.S. Pat. No. 4,115,768. This patent is incorporated by reference as if set forth herein. This decoder included an eight-bit shift register for framing all of the longest possible code sequence. Because the code contains two code bits for each binary bit, a single code bit error could create an error in four binary bits.

SUMMARY OF THE INVENTION

The invention comprises a sliding block decoder for the 2,7 variable length Franazek code. The decoder includes a four-bit shift register for framing the code stream and detecting code end sequences, and a second four-bit shift register for determining the sole code to binary ambiguity not resolving using the first shift register. The combination of the two shift registers decodes the 2,7 code with an error propagation of three binary bits.

BRIEF DESCRIPTION OF THE DRAWINGS

FIG. 1 shows the Franazek 2,7 variable length code.

DESCRIPTION OF THE PREFERRED EMBODIMENT

FIG. 1 shows a conversion table between binary and the 2,7 variable length code code and has seven elements. Each element comprises variable length strings of code and binary, running left to right in the figure. Note that the there are exactly two code bits for each binary bit, and further that each code word has either of two four-bit ending sequences: either 0100 or 1000. The three code elements having 1000 ending sequences each have a 11 binary ending sequence. These code elements' beginning sequence are "nothing", 00 or 00 00. These correspond to binary beginning sequences of "nothing", 0 or 0 0. Similarly, each of the 0100 code ending sequences corresponds with a 10 binary ending sequence except for element 5, which has a 00 binary ending sequence. Thus, except for element 5, these code elements' beginning sequences are also decoded into a corresponding number (divided by 2) of beginning binary zeros. Element 5 is distinguishable from the other 0100 elements and from element 6 because the four consecutive leading code bits of element 5 are all zero (each code element has two trailing zeroes and element 5 has two leading zeroes, while element 6 has a non zero bit in the second preceding code bit).

Figure 2:
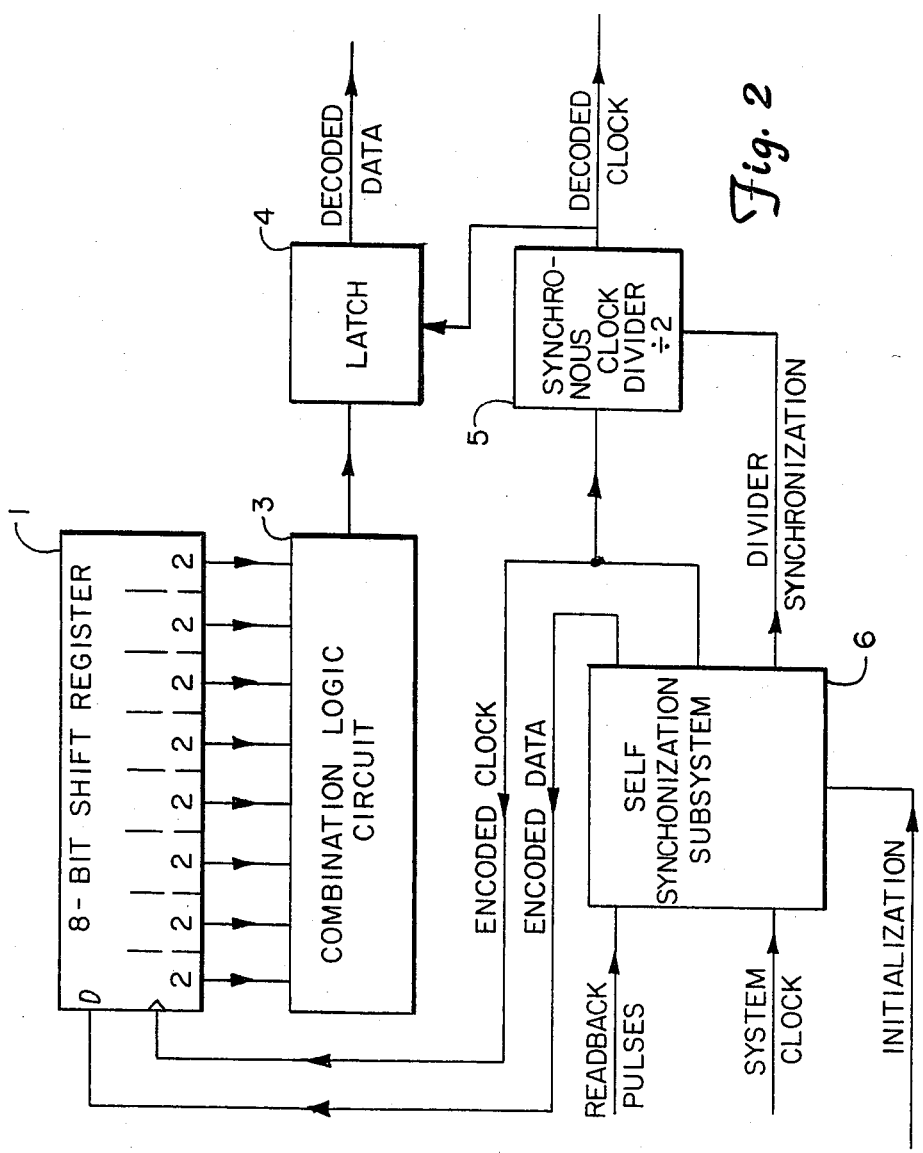
FIG. 2 is a rough schematic of the Eggenberger decoder of the prior art.

FIG. 2 shows the prior art Eggenberger et al. decoder (see FIGS. 6 and 7 of U.S. Pat. No. 4,115,768) for decoding the above code. Read-back pulses from, for example, a magnetic disk, are input to a self synchronization system 6 which derives a clock signal from the data and provides the data to an eight-bit shift register 1, bit by bit, as clocked by the recovered encoded clock. As each two bits of code bits are framed, a combination logic circuit detects those code patterns which invariably produce a binary one output and provide a one output to a latch 4, otherwise the logic provides a zero output. The Eggenberger specification is a little confusing because the logic equations and the circuit diagrams are inconsistent. However, the circuit diagram of FIG. 8 corresponds to the example of FIG. 9, and should be taken as correct. Thus the logic equation of the Eggenberger decoder should be $p = c + e(h\text{-not}) + b(d\text{-not})f + af$. Latch 4 is clocked by clock divider circuit 5 driven by the encoded clock from synchronization circuit 6.

Figure 3:
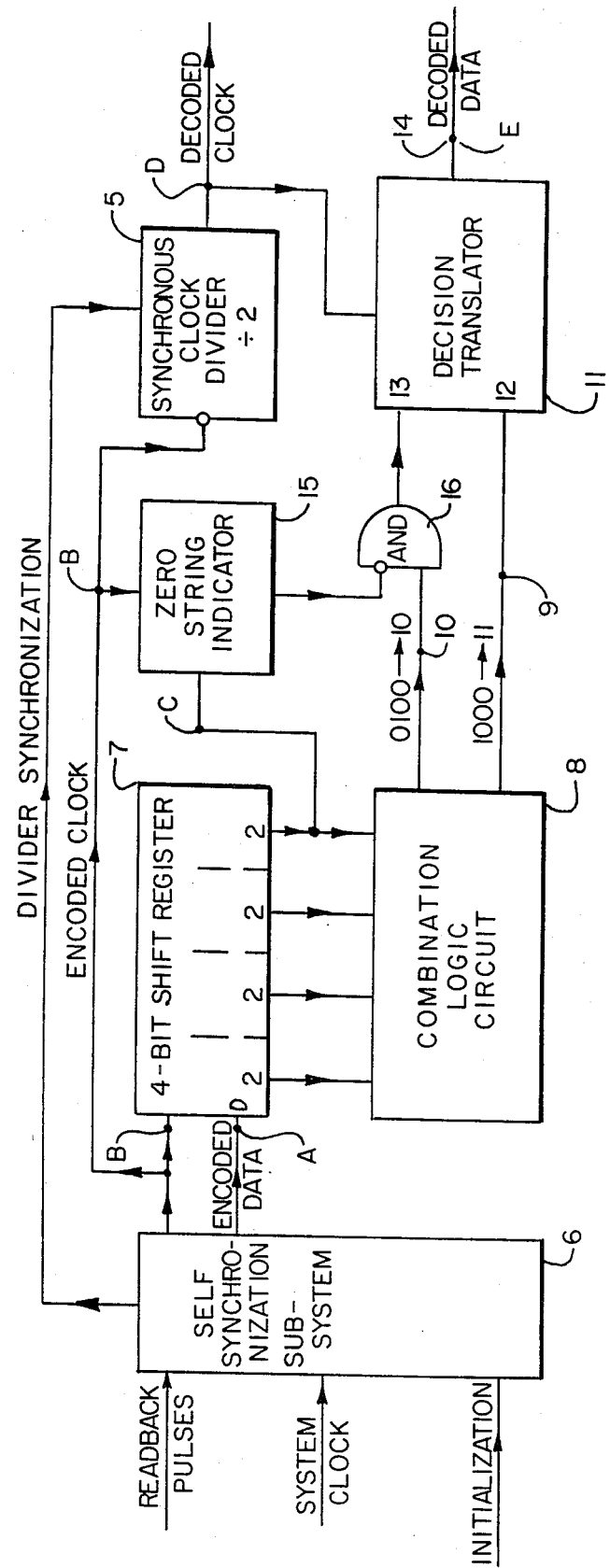
FIG. 3 is a rough schematic of the decoder of the preferred embodiment.

Applicant's preferred decoder is shown in rough schematic in FIG. 3. Synchronizer 6, and divider 5 are unchanged from Eggenberger. Instead of a single eight-bit shift register, applicant provides two four-bit shift registers 7 and 15, clocked as before with the encoded clock. Data enters the ending sequence shift register 7 first, bit by bit, and shifts the data, to the right. Data bits exiting the right-most stage of shift register 7 enter the lowest order stage of the zero-string shift register 15.

The outputs 2 of the first shift register stages are input to a combination logic 8, which provides a high output on a first output 10 when the pattern 0010 (left to right on the stage outputs 2 or 0100 from FIG. 1) is detected and a high output on a second output 9 when the pattern 0001 (left to right in the stage outputs 2 or 1000 from FIG. 1) is detected. These are the aforementioned end sequences. The first output 10 is provided to an AND gate 16 whose other input is high when the zero string indicator shift register 15 contains at least one non zero bit in the three highest ordered stages. The output of the AND gate 16 is input to a decision translator 11 on input 13, and causes the translator to output a 10 binary pattern on the next two clocks from divider 5. The second output 9 from the combination logic is input to a second input 12 of the translator 11, and causes the translator to output a 11 pattern on the next to clocks from divider 5. Unless one of the two inputs 12, 13 are high, the translator outputs a binary zero on its output 14 when clocked by divider 5, which provides, as in Eggenberger, a clock every two code bit clocks.

Figure 4:
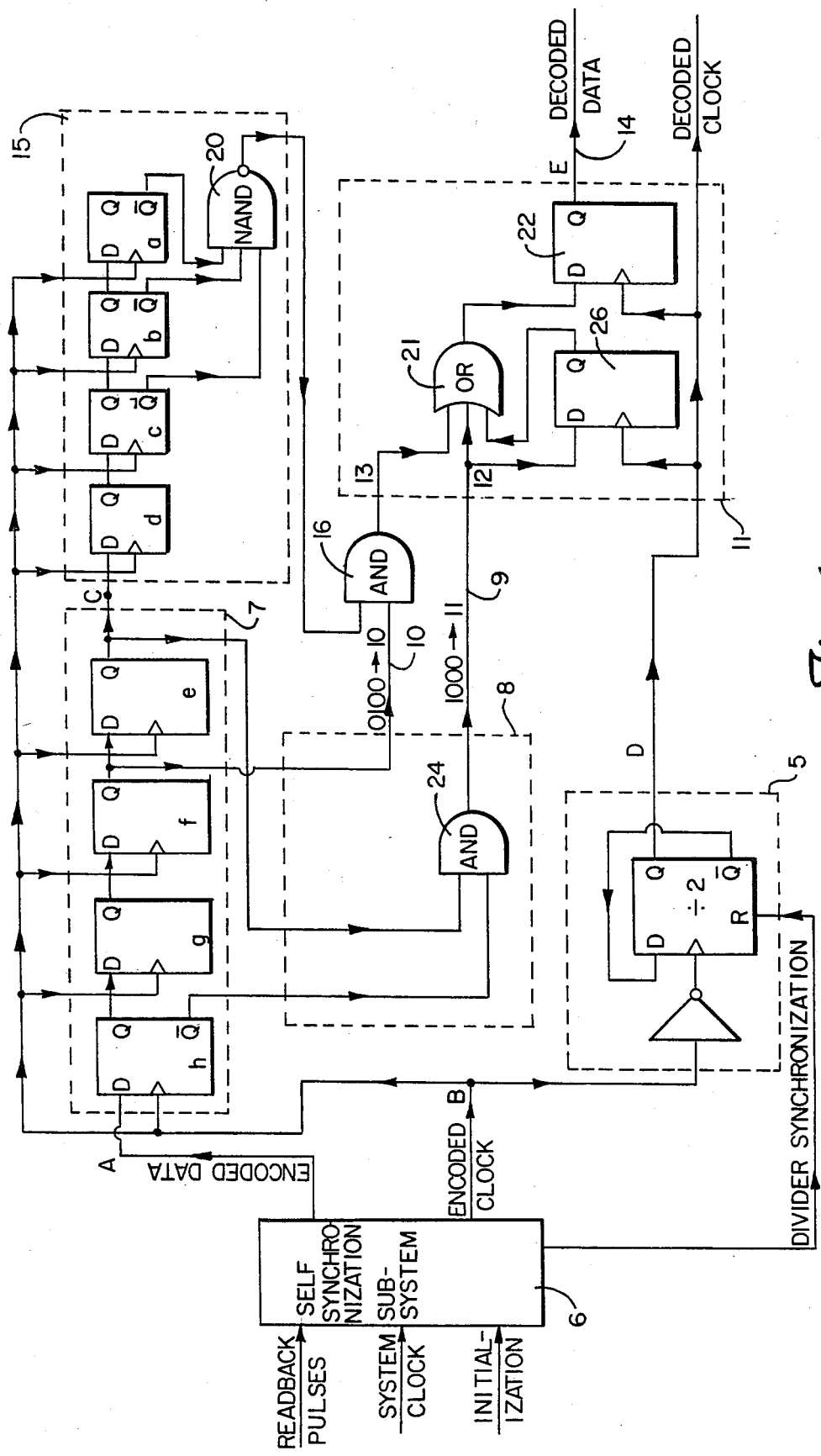
FIG. 4 is a more detailed schematic of the decoder of the preferred embodiment.

FIG. 4 is a more detailed schematic of the preferred embodiment as shown in FIG. 3. Data from the self synchronization subsystem 6 is input into the leftmost stage of the end sequence shift register 7. At each clock (again from the subsystem 6) the contents of each stage copies into the next, left to right. After four clocks, the output of the rightmost stage is copied into the leftmost stage of the zero string indicator shift register 15. Again, at each clock of the encoded clock from subsystem 6, the contents of each stage is copied to the next stage right.

Each stage has both a Q and a Q-not output. The stages right to left in the Figure have been labelled "a" to "h", to correspond to the labelling used in the Eggenberger patent. The Q-not outputs of stages "a" to "c" are input to NAND gate 20, whose output is fed to AND gate 16. Logically, the output of the NAND gate is a-not + b-not + c-not and the input to the AND gate will be high if any of stages a-c are non zero.

The output of stage f is also input to AND gate 16. This output is high when "0100" (FIG. 1) ending sequences are present in the shift register. Thus the output of AND 16 gate is high when a "0100" W pattern is present in stages e–h (0010 in the stages of the Figure, left to right) and any of the stages a–c are non zero. Referring to FIG. 1. When element 1 is present in the stages e–h, a preceding element end sequence must be in stages a–d, and one of "a" or "b" must be non-zero. Thus the output of AND gate is high. When element 3 is present, the beginning sequence comprising a "10" pattern is present in stages d,c respectively, and "c" is high. AND gate's 16 output will be high. Similarly, if element 6 is present in stages e–h, its beginning sequence of "0010" will be present in stages d–a respectively, and stage c will be high. AND gate's 16 output will be high. However, when element 5 is present, it beginning sequence "00" and the preceding element's ending "00" are present in d–a, and the output of AND gate 16 is low.

The output of AND gate 16 is input to an OR gate 21 whose output is connected to the D input of flip-flop 22, which is clocked by synchronous divider 5 (see Eggenberger for operation of the divider 5). The synchronous divider outputs a clock every time two code bits are clocked into the shift registers 7 and 15. Thus when AND gate 16 is high, and a clock is received from the divider 5, the flip flop's output 14 goes high. After two more code bits are clocked in, the output of flip-flop 22 goes low, because the ending "00" of "0100" will now be in stages f,e, and the output to AND gate 16 from stage f is low.

Thus, every time the two stages in combination with AND gate 16 recognized one of the elements 1, 3 or 6, flip flop 22 outputs a binary "10" pattern. If elements 3 or 6 are present, the clocking in of their beginning sequences will result in leading binary zeros being clocked out of flip-flop 22. If element 5 is in the shift registers, AND gate 16 never goes high, and three binary zeros are clocked out corresponding to the six code bits of the element.

Elements 2, 4 and 7 are handled similarly. If their ending sequence of "1000" (0001 left to right in the Figure) are present in stages h–e, stage e's Q output will be high, and stage h's Q-not output will be low. These respective outputs are respective inputs to AND gate 24, whose output is connect both to the OR gate 21 and to the D input of flip flop 26. When the ending sequence is present, AND gate 24 is high, the output of the OR gate is high, and when a clock is received from divider 5, flip flops 22 and 26 go high. The output from flip flop 22 comprises one binary "1" output. After two more code bits have been clocked into the registers 7 and 15, AND gate 24 is no longer high, but the Q output of flip flop 26 is still high, and so is the output of OR gate 21 because this flip flop's output is input to the OR gate 21. Thus, when the clock comes in from divider 5, the output of flip flop 22 remains high. This is the second binary "1" output. However, as the clock also clocks flip flop 26 whose input is connected to now low AND gate 24, flip flop 26 goes low and will not act to set flip flop 22 for at least another two code bits.

Summarizing, when the "1000" end pattern is recognized by end sequence shift register 7 and AND gate 24, the logic causes flip flop 22 to output two consecutive 1's or a 11 binary pattern. Elements 4 and 7 beginning sequences are not recognized as ending sequences, and flip flop 22 outputs zeros at the receipt of a clock from divider 5, one zero for element 4 with two code bits as a beginning sequence, and two zeroes for element 7 with four code bits as a beginning sequence.

If flip flop 26 is labelled "j" and flip flop 22 labelled "k", the logic for the preferred embodiment is $j = e(h\text{-not})$ $k = e(h\text{-not}) + j + f(a\text{-not} + b\text{-not} + c\text{-not})$ The above described circuitry, because it searches only for the four-bit code end sequences or a specific beginning sequence, can have no more than three consecutive binary bits in error for a single code-bit error. As mentioned before, the Eggenberger decoder had at least a four-bit binary error propagation.

I claim:

1. In a variable length 2,7 decoder having a shift register with stages "a" to "h" each clocked by an encoded clock means connected to a source of coded bits having the 2,7 variable length code, the coded bits entering the shift register at stage "h" and being shifted successively to lower ordered stages of the shift register to the last stage "a" in response to clocks from said clock means, a combination logic means connected to predetermined elements of the stages, and a binary output means whose input is connected to the combination logic means for outputting binary bits, said binary output means clocked by a divide-by-two clock means responsive to said encoded clock means, the improvement comprising:
   a flip flop whose input is connected to said combination logic means and clocked by said divide-by-two clock means, the output of which is connected to said binary output means;
   said combination logic means includes means to set the flip flop input high when stage "e" contains a code "one" bit and stage h contains a code "zero" bit; and
   said combination logic means includes means to set the binary output means input high when stage "e" contains a code "one" bit and stage "h" contains a code "zero" bit or when stage "f" contains a code "one" bit and one of stages "a" to "c" contains a code "one" bit or when the output of said flip flop is high.

2. In a variable length 2,7 decoder having a shift register with stages "a" to "h" each clocked by an encoded clock means connected to a source of coded bits having the 2,7 variable length code, the coded bits entering the shift register at stage "h" and being shifted successively to lower ordered stages of the shift register to the last stage "a" in response to clocks from said clock means, a combination logic means connected to predetermined elements of the stages, and a binary output means whose input is connected to the combination logic for outputting binary bits on an output "k", said binary output means clocked by a divide-by-two clock means responsive to said encoded clock means, the improvement comprising:
   a "j" flip flop means whose input is connected to said combination logic means and clocked by said divide-by-two clock means, the output of which is connected through said combination logic means to the input of said binary output means; and
   and wherein said combination logic means causes the output "k" of said binary output means to produce a "one" output according to the following logic equations:

$$j = e(h\text{-not})$$

$$k = e(h\text{-not}) + j + f(a\text{-not} + b\text{-not} + c\text{-not}),$$

said "k" output producing a "zero" output when clocked when said logic equation is not satisfied and wherein "-not" in conjunction with a letter indicates the logical complement of the letter, i.e., when "h" is zero, "h-not" is one.

* * * * *